United States Patent
Barrenscheen et al.

(10) Patent No.: US 10,012,680 B2
(45) Date of Patent: Jul. 3, 2018

(54) AC INPUT SIGNAL DETECTION

(71) Applicant: Infineon Technologies Austria AG, Villach (AT)

(72) Inventors: Jens Barrenscheen, Munich (DE); Josef Neulinger, Petershausen (DE)

(73) Assignee: Infineon Technologies Austria AG, Villach (AT)

(*) Notice: Subject to any disclaimer, the term of this patent is extended or adjusted under 35 U.S.C. 154(b) by 335 days.

(21) Appl. No.: 14/581,374

(22) Filed: Dec. 23, 2014

(65) Prior Publication Data

US 2015/0233979 A1   Aug. 20, 2015

Related U.S. Application Data

(60) Provisional application No. 61/940,001, filed on Feb. 14, 2014.

(51) Int. Cl.
    *G01R 19/00*   (2006.01)
    *G01R 19/257*  (2006.01)
    *G01R 19/165*  (2006.01)

(52) U.S. Cl.
    CPC .... *G01R 19/16547* (2013.01); *G01R 19/0053* (2013.01)

(58) Field of Classification Search
    CPC .............. G01R 31/40; G01R 19/16547; G01R 19/2513; G01R 19/00; G01R 19/02; G01R 19/04; G01R 19/145; G01R 19/165; G01R 19/2506; G01R 19/255; G01R 19/257; G01R 23/02; G01R 23/06; G01R 31/02; G01R 31/025; G01R 31/08; G01R 33/34; G01R 33/36; G01R 33/4828; G01R 33/483; G01R 19/0053; G06F 1/30; G06F 1/305;
    (Continued)

(56) References Cited

U.S. PATENT DOCUMENTS 6,366,864 B1  4/2002 Kulidjian et al.
7,742,884 B2  6/2010 Oda
(Continued)

FOREIGN PATENT DOCUMENTS

CN   1302465 A    7/2001
CN   101179184 A  5/2008
(Continued)

OTHER PUBLICATIONS

Office Action, in the Chinese language, from counterpart Chinese Application No. 201510079095.5, dated Mar. 31, 2017, 5 pp.
(Continued)

*Primary Examiner* — Tung X Nguyen
*Assistant Examiner* — Lee Rodak
(74) *Attorney, Agent, or Firm* — Shumaker & Sieffert, P.A.

(57) ABSTRACT

Techniques for AC input signal detection, whereby a method for AC input signal detection may include: sampling an input signal at a sampling rate, where the input signal is based on an AC signal; comparing the input signal with a threshold signal, determining a first value in case the input signal is larger than the threshold signal; determining at least one second value in case the input signal is smaller than the threshold signal; increasing the sampling rate in case a predefined number of consecutive first values is determined; and decreasing the sampling rate in case the at least one second value is determined.

21 Claims, 6 Drawing Sheets

(58) Field of Classification Search
CPC ............ H02H 3/207; H02H 3/24; H02H 3/46; H02H 3/04
USPC .... 324/120, 76.11, 119, 76.15, 76.24, 76.42, 324/76.39, 522, 606, 647; 702/60–80
See application file for complete search history.

(56) References Cited

U.S. PATENT DOCUMENTS

| | | | |
|---|---|---|---|
| 8,214,165 | B2 | 7/2012 | Dishman et al. |
| 8,482,297 | B2 | 7/2013 | Xie |
| 8,710,806 | B2 | 4/2014 | Moon et al. |
| 2010/0085035 | A1* | 4/2010 | Fornage ............. G01R 19/2513 324/76.12 |
| 2010/0169031 | A1* | 7/2010 | Dishman ................ G01R 31/40 702/60 |
| 2012/0105016 | A1* | 5/2012 | Moon .................... H02M 1/36 320/166 |
| 2014/0184145 | A1* | 7/2014 | Degen ..................... H03K 5/14 320/107 |
| 2014/0268938 | A1* | 9/2014 | Matthews ............... H02M 1/32 363/50 |
| 2015/0355245 | A1* | 12/2015 | Ordanis ............... G01R 21/133 702/62 |

FOREIGN PATENT DOCUMENTS

| | | |
|---|---|---|
| CN | 101769997 A | 7/2010 |
| CN | 102129047 A | 7/2011 |
| CN | 102457180 A | 5/2012 |
| CN | 102841297 A | 12/2012 |

OTHER PUBLICATIONS

Office Action, in Chinese, from counterpart Chinese Patent Application No. 201510079095.5, dated Nov. 1, 2017, 7 pp.
Office Action, in the German language, from counterpart German Application No. 102015102116.1, dated Mar. 26, 2018, 10 pp.

* cited by examiner

AC INPUT SIGNAL DETECTION

This application claims the benefit of U.S. Provisional Application No. 61/940,001, filed on Feb. 14, 2014, the entire content of which is incorporated herein by reference.

TECHNICAL FIELD

Examples of the present disclosure relate to a detection that allows determining whether or not an AC (alternating) signal is present at an input stage of a power supply.

SUMMARY

A first example relates to a method comprising the steps:
- sampling an input signal at a sampling rate, wherein the input signal is based on an AC signal;
- comparing the input signal with a threshold signal;
- determining a first value in case the input signal is larger than the threshold signal;
- determining at least one second value in case the input signal is smaller than the threshold signal;
- increasing the sampling rate in case a predefined number of consecutive first values is determined;
- decreasing the sampling rate in case the at least one second value is determined.

A second example relates to a device comprising a processing unit that is arranged for
- sampling an input signal at a sampling rate, wherein the input signal is based on an AC signal;
- comparing the input signal with a threshold signal;
- determining a first value in case the input signal is larger than the threshold signal;
- determining at least one second value in case the input signal is smaller than the threshold signal;
- increasing the sampling rate in case a predefined number of consecutive first values is determined;
- decreasing the sampling rate in case the at least one second value is determined.

A third example relates to a device comprising:
- means for sampling an input signal at a sampling rate, wherein the input signal is based on an AC signal;
- means for comparing the input signal with a threshold signal;
- means for determining a first value in case the input signal is larger than the threshold signal;
- means for determining at least one second value in case the input signal is smaller than the threshold signal;
- means for increasing the sampling rate in case a predefined number of consecutive first values is determined;
- means for decreasing the sampling rate in case the at least one second value is determined.

A forth example is directed to a computer program product directly loadable into a memory of a digital processing device, comprising software code portions for performing the steps of the method described herein.

BRIEF DESCRIPTION OF THE DRAWINGS

Example details of this disclosure are shown and illustrated with reference to the drawings. The drawings serve to illustrate the basic principle, so that only aspects necessary for understanding the basic principle are illustrated. The drawings are not necessarily to scale. In the drawings the same reference characters denote like features.

DETAILED DESCRIPTION

In some examples power converters, such as a flyback converter, may be used in a device (e.g., a mobile device, smartphone, tablet computer, laptop computer, wearable computing device, or any other device that requires power) to convert AC power from an AC power source (e.g., an AC power main) into a format that is useable by the computing device, to directly power the device or to charge a power storage component of the device such as a battery.

Safety norms or safety requirements may stipulate discharging a capacitance (comprising at least one capacitor) of a filter coil within a predefined time once a (e.g., switched mode) power supply is disconnected from an AC line and the capacitance stores a voltage above a particular threshold, e.g., 48V. Hence, if a plug of the power supply is disconnected from the plug socket, the capacitance may still store a high voltage which is then accessible via the pins of the plug. The examples provided ensure in particular that such high voltage after the plug being disconnected is reduced to a predetermined threshold within a predetermined time such that the pins of the plug can be touched without inflicting any harm.

The capacitance may comprise at least one X capacitor connected across the AC line at the primary side and/or the secondary side of the filter coil. This capacitance may be used as an EMI (electromagnetic interference) capacitance at the filter coil.

The EMI filter may comprise a coil. In this regard, the AC line may be connected, e.g., across the EMI filter.

According to an example, AC detection is achieved by monitoring a rectified AC voltage and to wake-up and/or to inform a system when a pre-configured threshold voltage is reached, exceeded and/or fallen below, in particular for a specified period of time. The system may comprise a central processing unit (CPU) and/or a microcontroller and/or any type of state machine controlling appropriate actions of the system.

Figure 1:
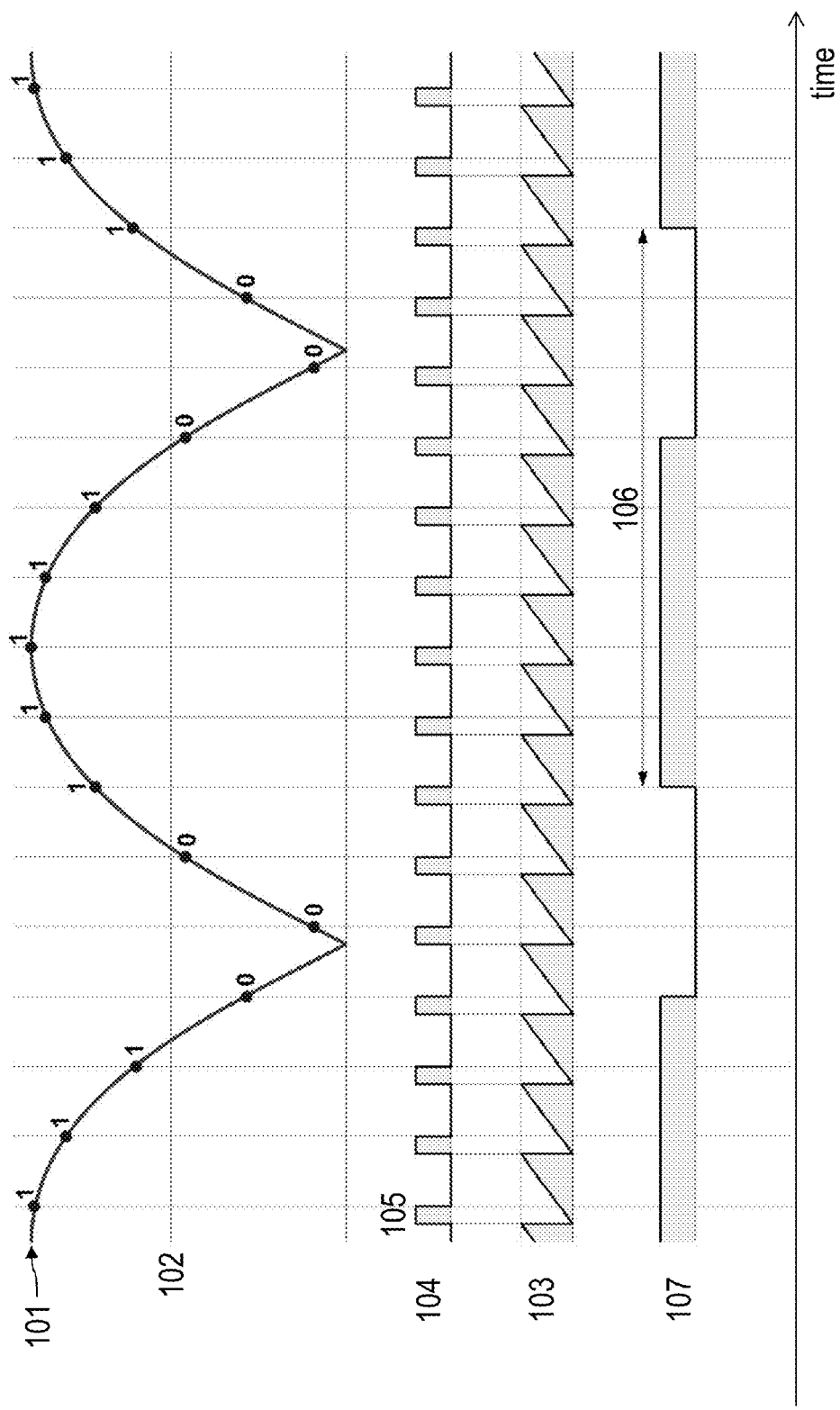
FIG. 1 shows a schematic diagram of a rectified AC signal that is compared with a threshold as well as a timer signal that triggers a measurement phase signal, which results in a sample signal.

FIG. 1 shows a schematic diagram of a rectified AC signal 101 that is compared with a threshold 102. If the rectified AC signal 101 is above the threshold 102, the comparison results in a "1" value and if the rectified AC signal 101 falls below the threshold 102, the comparison results in a "0" value. If the rectified AC signal 101 equals the threshold 102, the comparison may result in a "1" value or in a "0" value according to a respective implementation.

Via a timer signal 103, a measurement phase signal 104 is generated that triggers measurements for a given duration 105. At the end of each duration 105, a comparison result (in this example either the value "0" or the value "1") is available. Hence, the timer signal 103 determines a sampling rate (also referred to as sampling frequency which corresponds to a sample period) that is applied to the rectified AC signal 101.

A measurement time 106 may correspond to a (e.g., half) period of the AC signal comprising (in this example of FIG. 1) one of the rectified half-waves of the rectified AC signal 101. The measurement time 106 may be derived from a timer. According to another example, the measurement time 106 may be larger than one half-wave of the rectified AC signal 101.

As an alternative (or in addition), the measurement time 106 may be based on a predefined count of subsequent "1" values reaching a predefined number. The measurement time 106 may be cleared (i.e. start again) after a "0" value is detected.

A sample signal 107 shows the result of the timer signal 103 applied to the rectified AC signal 101. The sample signal 107 amounts to "1" until the first "0" value is detected by the comparison and it remains "0" until the next "1" value is detected, etc.

Thus, according to the sampling rate adjusted by the timer signal 103 (i.e. a length of the ramp of the timer signal 103) and according to the shape of the rectified AC signal 101, no "0" may be detected during a measurement time 106, i.e. the sampling does not reveal that the threshold 102 has been undercut during the recent measurement time 106. This may be an indication of a high voltage across the capacitance connected to the AC line, which may happen after the plug has been disconnected from its socket. Alternatively, it may be an indication that the sampling rate was too low to detect at least one of the "0" values.

In such case, an escalation scheme is utilized that increases the sampling frequency. If the increased sampling frequency does still not reveal any "0" value at the end of the given measurement time 106, the sampling frequency may successively be further increased, e.g., until a maximum escalation stage is reached. However, as soon as at least one "0" value is detected, the escalation may be reduced, in particular cleared to its initial value, i.e. the initial sampling frequency.

For example, if the plug of the power supply has been disconnected from its socket, the capacitors of the EMI filter across the AC line supply high voltage to the pins of the plug. Without any connection to the AC line, for as long as the high voltage is stored in the capacitors, the signal 101 may not fall below the threshold 102 and hence only "1" values are detected by the solution described. After a number of n "1" values are detected, a next escalation stage applies a higher sampling frequency (via shorter ramps of the timer signal 103). After m "1" values are detected on this next escalation stage, a subsequent escalation stage applies a further increased sampling frequency (via even shorter ramps of the timer signal 103). However, the numbers n and m of "1" values of different escalation stages may be identical or at least partially different. It is noted that several escalation stages can be used according to this scheme. Advantageously, in this example of the disconnected plug, the remaining energy stored in the capacitors is reduced due to the increasing load inflicted by the rising sampling frequency. Hence, the higher the sampling frequency, the faster the capacitors are discharged and the sooner the signal 101 falls below the threshold 102. The threshold 102 is preferably set such that the voltage that is then accessible at the pins of the (disconnected) plug has no harming effect, for example when being touched by a finger.

On the other hand, if, for example, the plug of the power switch is still connected to its socket, but the sampling frequency was too low to detect any "0" value (i.e. voltage below the threshold 102), the first escalation stage by increasing the sampling frequency increases the probability that a "0" value can be found. If still no "0" value can be found, the sampling frequency is further increased, e.g., until one "0" value can be found. After a "0" value was detected, the circuitry may return to its initial sampling frequency. This bears the advantage that the examples presented may adjust itself to an energy-efficient sampling that still allows determining "0" values. This is in particular useful in case the quality of the tapped (in particular rectified) AC signal is not known or in case parasitic effects deteriorate the curve of the tapped AC signal. This also allows one or more examples described herein to efficiently react to dynamic changes of the tapped AC signal and to temporarily increase a load (due to the increased sampling rate) when needed for determining whether a "0" value exists or for discharging the capacitance connected to the AC line. Depending on the escalation step, also the duration 105 of the measurement may be adjusted, e.g., lengthened for higher sampling rates to increase the resulting load.

The examples presented are in particular useful for various kinds of AC detection applications, for example for power supplies, converters, etc. The examples can be applied in all kinds of electronic devices that may in particular utilize any (e.g., switching) power supply.

Figure 2:
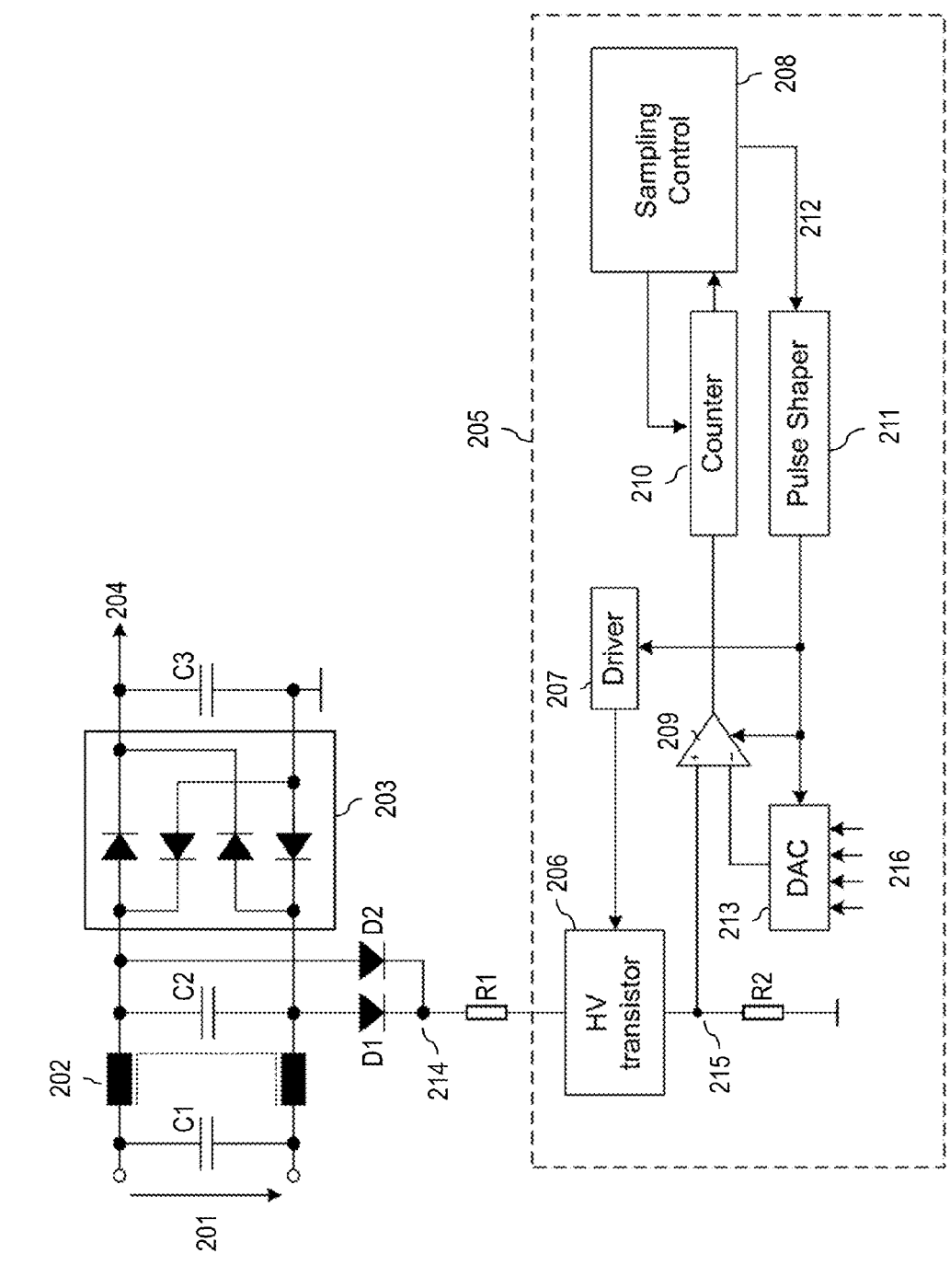
FIG. 2 shows an exemplary schematic diagram of an AC detection unit that is connected to a power supply.

FIG. 2 shows an exemplary schematic diagram of an AC detection unit 205 that is connected to a power supply.

FIG. 2 depicts an exemplary portion of a power supply that is connected to an AC line 201. The AC line may supply an AC voltage, for example in the range between 80V and 270V. The AC line 201 is connected to a primary side of a filter coil 202, wherein a capacitor C1 is also connected across the primary side of the filter coil 202. A capacitor C2 is connected across a secondary side of the filter coil 202 and the secondary side of the filter coil is further connected to a rectifier 203. A capacitor C3 is connected across the output of the rectifier 203 and a positive rectified signal 204 is conveyed for further processing to, e.g., a buck converter to provide a predefined DC voltage for a load (not shown in FIG. 2).

The two pins of the secondary side of the filter coil 202 are tapped, wherein each of the pins is connected via a separate diode D1, D2 to a node 214. Each of the cathodes of the diodes D1 and D2 points towards the node 214. The node 214 is connected via a resistor R1 with a high voltage (HV) transistor 206. The HV transistor 206 can be any transistor, MOSFET, IGBT or the like. The HV transistor 206 is further connected to a node 215, wherein the node 215 is connected via a resistor R2 to ground. The HV transistor 206 is controlled via a driver 207. If the HV transistor 206 is an N-MOS-type transistor, the drain is connected to the resistor R1 and the source is connected to the node 215. The gate of such transistor is controlled via the driver 207.

According to an example, the HV transistor may be a "normally-on" type transistor, e.g., a depletion transistor.

It is noted that the HV transistor 206 may be part of the AC detection unit 205 or it may be an electronic switch separate to the AC detection unit 205. It is in particular noted that the AC detection 205 unit may be implemented on a single chip or die, it may in particular be realized as an integrated circuit.

The resistors R1 and R2 determine a voltage divider. The resistor R2 may be implemented as an adjustable resistor, e.g., an array of resistors that can be selected individually or in combinations. An adjustable resistor R2 has the advantage that the voltage across the resistor R2 can be flexibly adjusted based on various (fixed) resistors R1. Hence, the AC detection unit 205 can be efficiently used in combination with different resistors R1.

A high voltage path comprises the resistors R1. R2 and the HV transistor 206. A current at the resistor R2 (shunt resistor) depends on the voltage of the AC line 201. Depending on the application (defining the value of R1) and a given value of R2, the threshold 102 of the comparator 209 may need to be adjusted. Therefore, a DAC mechanism can be used.

The values of R1, R2 and the DAC threshold may define a level of the AC input that is considered "low enough" for discharging the capacitors C1 and C2.

The node 215 is used to measure the AC voltage across the output of the EMI filter. Hence, the node 215 is connected to the positive input of a comparator 209 (which may be realized comprising at least one operational amplifier). The negative input of the comparator 209 is connected with an output of a digital-to-analog converter (DAC) 213. A digital signal 216 is applied to the DAC 213 to provide a threshold value to the negative input of the comparator 209 to which the voltage at the node 215 is compared. The output of the comparator 209 is conveyed to a counter 210. The counter may comprise at least two counter for counting "0" values and "1" values occurring at the output of the comparator 209. The counter 210 may in particular comprise a counter for determining a single "0" value and a counter for determining subsequent "1" values. As an alternative to reduce effects due to noise, a different number of "0" values may be determined. For example a number k "0" values which do not have to be subsequent to each other.

The results of the counter 210 are conveyed to a sampling control 208, which may conduct an escalation (if needed). The sampling control 208 determines a sampling period 212 and/or the duration 105 of the measurement, also defined by the sampling period 212 that is conveyed to a pulse shaper 211.

Based on the results of the counter 210, the sampling control 208 may adjust a configuration of the counter 210 and/or it may adjust the sampling period 212 to be used by the pulse shaper 211.

It is noted that the sampling period 212 may set how often and when samples are to be determined. The pulse shaper 211 forms a timer signal (see timer signal 103 in FIG. 1) based on the sampling period 212. Hence, based on the sampling period 212, the pulse shaper 211 determines a length of the measurement window (e.g., how many consecutive "1" values are to be determined) and a trigger (i.e. when the output of the comparator 209 is be sampled).

The pulse shaper 211 activates the driver 207 and it may enable the DAC 213 and/or the comparator 209.

For example, an initialization phase may be conducted prior to the first actual AC measurement. During such initialization phase, the pulse shaper 211 may wait for a predetermined duration (e.g., a number of cycles of its timer) before activating the driver 207.

It is noted that an amount of energy that is conveyed from the tapped power supply to the AC detection unit 205 can be used to measure the AC signal. In particular, if the duration during which the HV transistor 206 is closed is longer than the amount of time required for sampling purposes, the energy consumption of the detection unit 205 can be used to efficiently discharge the capacitors C1 and C2.

Hence, the example shown in FIG. 2 allows at least partially discharging the capacitors C1 and C2 within a predetermined time by the escalation scheme as described herein. The voltage at the pins of the plug after the plug has been disconnected from the AC network thus reaches of falls below a predetermined threshold (e.g., 48V) within said predetermined time.

The escalation scheme can in particular be provided by the sampling control 208. It can be implemented in software, hardware or firmware or any combination thereof.

Figure 3:
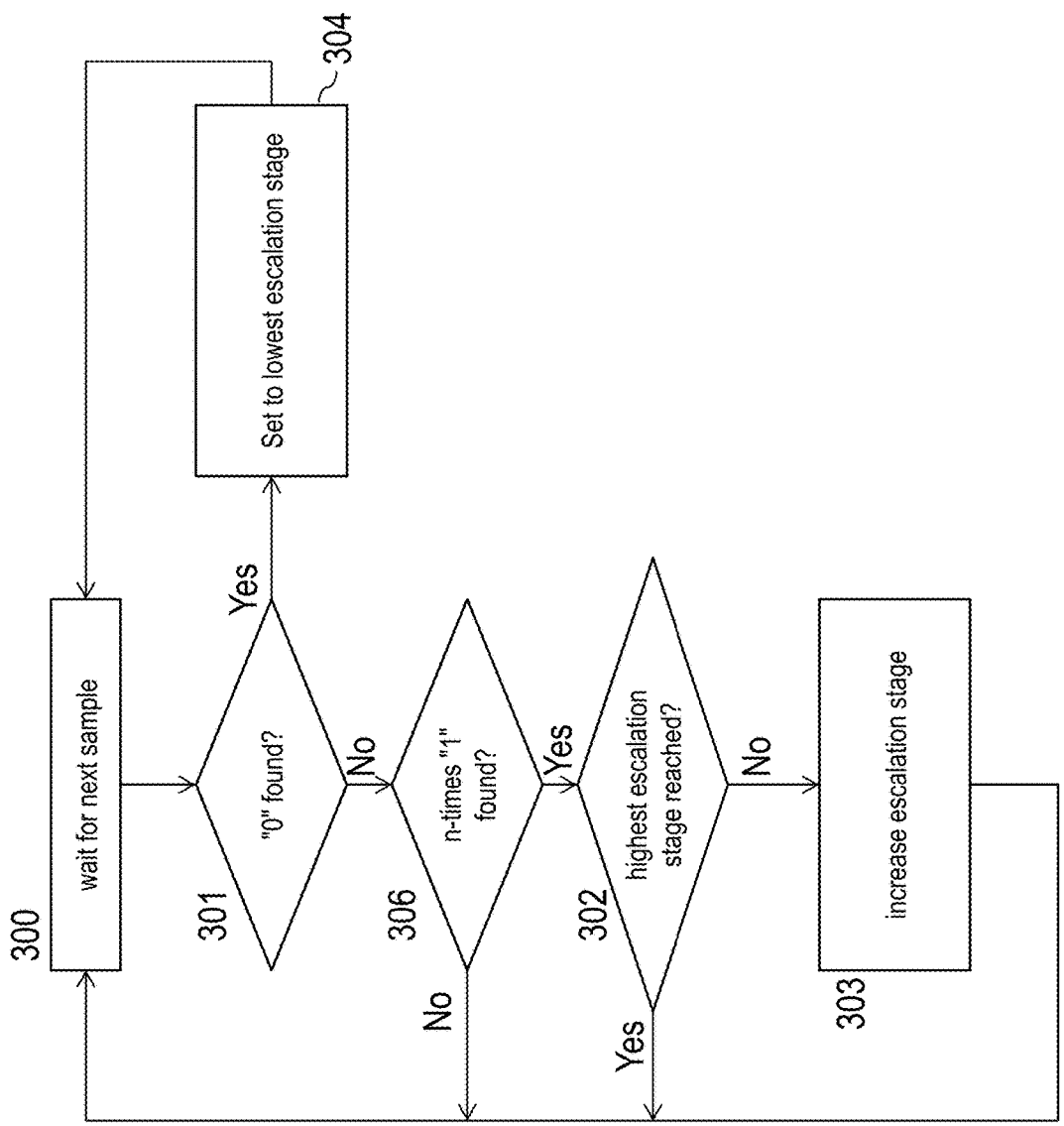
FIG. 3 shows a block diagram comprising steps of the escalation scheme, wherein a subsequent escalation stage is invoked based on a predetermined number of n consecutive "1" values, wherein each "1" value indicates that the AC voltage is above a predefined threshold.

FIG. 3 shows a block diagram comprising steps of the escalation scheme. According to the example of FIG. 3, the counter 210 as shown in FIG. 2, may comprise two different counter, i.e. a so-called "0-counter" determining single "0" values and a so-called "11-counter" determining consecutive "1" values at the output of the comparator 209. The 11-counter may in particular determine a number of n subsequent "1" values. An exemplary value for n may be 16.

In a step 300 the AC detection waits for a next sample from the comparator 209 output to be evaluated (which may correspond to waiting until the end of the duration 105 of the measurement according to FIG. 1).

In a step 301, it is determined whether the last AC measurement at the node 215 resulted in a "0" value at the output of the comparator 209. Such "0" value would (as shown in and explained with regard to FIG. 1) indicate that the AC voltage has fallen below the threshold 102.

If no "0" value has been found in step 301, it is determined in a step 306 whether a defined number of consecutive "1" values has been found. If this is not the case, the escalation stage is not changed.

If a number n of consecutive "1" values has been found in step 306, it is determined in a step 302 whether a last escalation stage has yet been reached. If this is the case, it is branched to step 300. Without the possibility of another escalation stage, there may be no need for counting subsequent "1" values. If step 306 indicates that n-times "1" values have not been found, it is continued with step 300.

If the last escalation stage has not been reached according to step 302, the escalation is increased to a next stage in a step 303.

Next to steps 303, 304 and 306 it may be continued with the step 300 for a subsequent measurement which may be a single "0" value or a measurement window of n subsequent "1" values.

Figure 4:
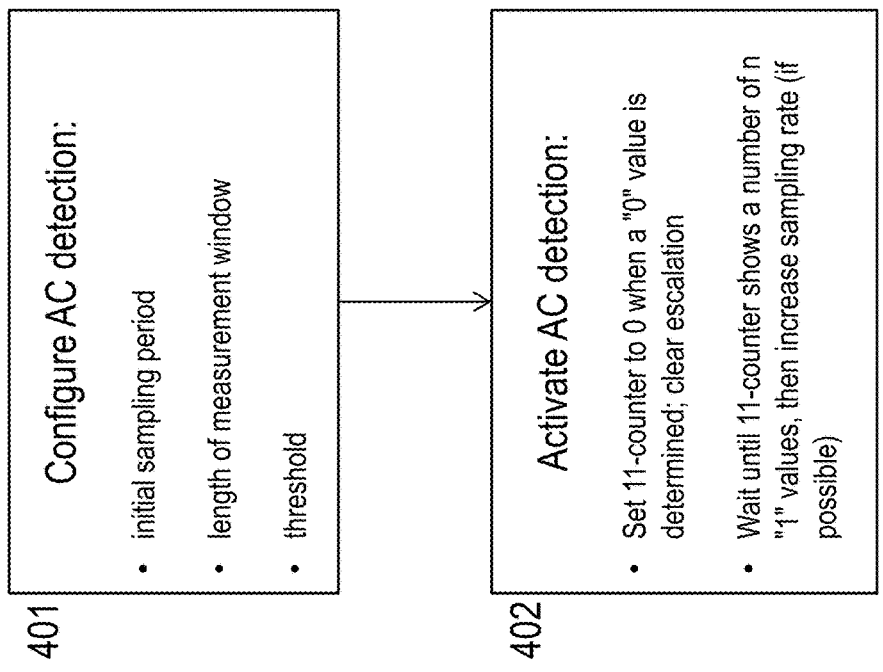
FIG. 4 shows an exemplary flow diagram comprising a configuration step and an activation step for an AC detection example.

FIG. 4 shows an exemplary flow diagram comprising a configuration step 401 and an activation step 402 for an AC detection example.

In the step 401, the configuration of the AC detection may determine an initial sampling period (sampling frequency). The initial sampling period may be in the range of the period of the AC supply signal. Preferably, the initial sampling period is a little longer or shorter (e.g., in the range of 5%-20%) than the period of the AC supply signal.

Also, the configuration of the AC detection may determine the length of the measurement window, i.e. the maximum duration of a measurement before a first (or a next) escalation (i.e. increase of the sampling frequency) is conducted. The length of the measurement window may be determined by a number n of subsequent "1" values. If n is reached or if n is exceeded, the next escalation stage will be used.

Further, the configuration of the AC detection may determine the threshold (see threshold 102 in FIG. 1). Falling below such threshold corresponds to a "0" value. The "0"

value may interrupt the sequence of consecutive "1" values and it may be used to clear the escalation (i.e. return to the initial sampling period).

The parameters sampling period, length of measurement window and/or threshold may be re-configured or adapted after the activation of the AC detection.

In the step 402, the AC detection is activated. AC measurement values at the node 215 are compared with the threshold supplied by the DAC 213. The result of each comparison at a sampling time is either a "0" value or a "1" value provided at the output of the comparator 209. The counter 210 may comprise the 1 l-counter and the 0-counter as described above with regard to FIG. 3. The 11-counter may be re-initialized (i.e. set to 0) when a "0" value is detected at the output of the comparator 209 (i.e. by the 0-counter). Also, the escalation is cleared in case the "0" value is detected. If no "0" value is detected, it is waited until the 11-counter indicates a predefined number n of consecutive "1" values. In such case, the sampling period is reduced (i.e. the sampling frequency is increased) in a next escalation stage (if such next escalation stage is available).

Figure 5:
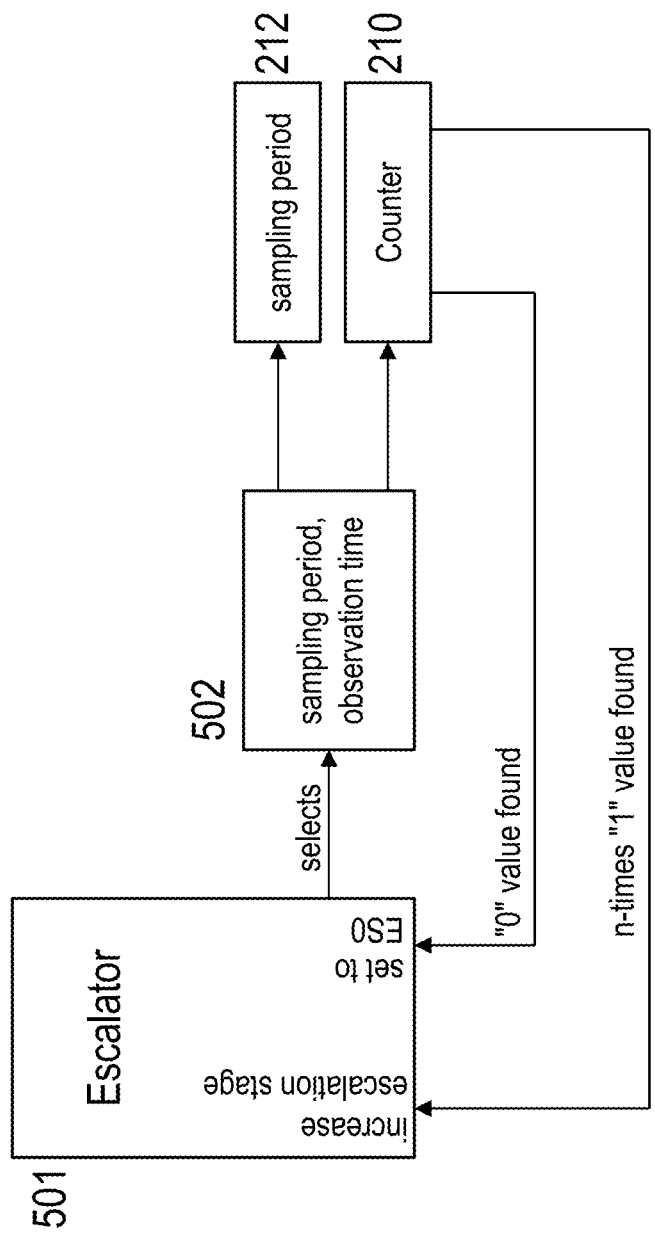
FIG. 5 shows a block diagram of an example as how an escalation may be conducted via the sampling control shown in FIG. 2.

FIG. 5 shows a block diagram of an example as how an escalation may be conducted via the sampling control 208 shown in FIG. 2.

FIG. 5 comprises an escalator 501 and a block 502 that comprises predefined values of sampling period and observation time (also referred to as length of the measurement window). The block 502 may be arranged as a look-up table to supply, based on the escalation stage the corresponding (predefined) values for the sampling period and the observation time. The escalator 501 may determine an actual escalation stage (e.g., from ES0 to ES5, ES0 corresponding to the basic sampling rate without escalation) and select via the block 502 the actual values for the sampling period and the observation time that correspond to the respective escalation stage ES0 to ES5. The escalator 501 and the block 502 may be part of the sampling control 208 as shown in FIG. 2.

As a result, the block 502 may supply the sampling period 212 to the pulse shaper 211 (see also FIG. 2) and the observation time to the counter 210. The observation time determines how many consecutive "1" values are determined before the next escalation stage is triggered. This number of consecutive "1" values to be expected may be individually set for each escalation stage ES0 to ES5 or it may be set for all or for a group of escalation stages. The observation time stems from the number of consecutive "1" values in combination with the sampling period. The observation time may vary from escalation stage to escalation stage. For example, if n consecutive "1" values are determined in each escalation stage and as the sampling period gets shorter with each escalation stage, the observation time also gets shorter when increasing the escalation stages. This approach can be used to significantly reduce the observation time between escalation stages. Hence, by configuring the number of consecutive "1" values per escalation stage, the number of escalation stages, the sampling period per escalation stage allows discharging the capacitors C1 and C2 (see FIG. 2) to the predefined threshold within the predefined time (e.g., 1 second) in case the plug of the power supply has been removed from its socket.

The counter 210 may indicate the event "'0' value found" to the escalator 501, the escalator 501 may then clear the escalation and select the sampling period and the observation time that correspond to the initial (escalation) stage ES0. The counter 210 may also indicate the event "n-times '1' value found" (also referred to as Nx "1"). In such case, the escalator 501 may increase the escalation stage (if another escalation stage is still available).

Figure 6:
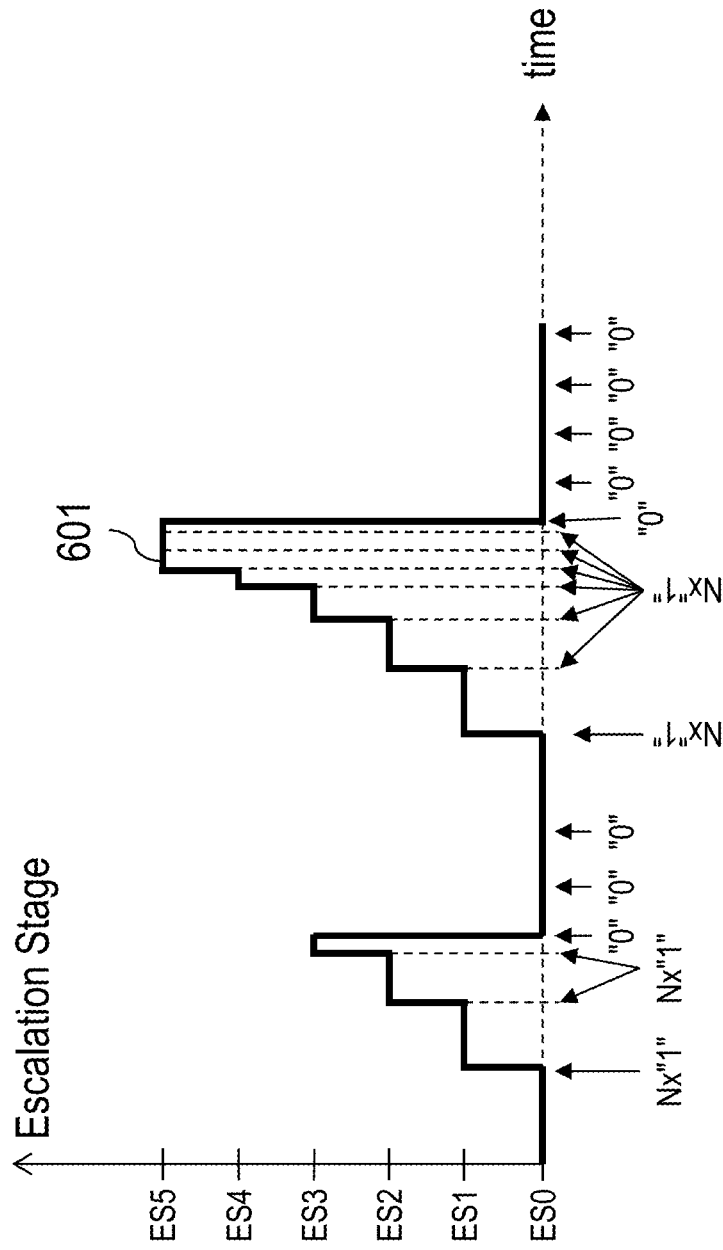
FIG. 6 shows an exemplary diagram depicting a curve of escalation stages selected over time.

FIG. 6 shows an exemplary diagram depicting a curve 601 of escalation stages selected over time. In the example, escalation stages ES0 to ES5 are shown, wherein the escalation stage ES0 corresponds to the basic setting of the sampling period and the observation time, i.e. the initial value set by the escalator 501.

In this example, for each escalation stage ES0 to ES5, the number n of consecutive "1" values to be determined prior to increasing the escalation is the same. However, the observation time is reduced from one escalation stage to another, because of the reduced sampling period. Hence, in case a large number of consecutive "1" values appear at the output of the comparator 209, the subsequent escalation stage will be reached sooner as the previous one.

Starting at escalation stage ES0 after a corresponding observation time determined by n consecutive "1" values, the escalator 501 reduces the sampling period (increases the sampling frequency) by selecting the escalation stage ES1. Again, at this escalation stage ES1, n consecutive "1" values are determined, the escalator 501 invokes escalation stage ES2. Once more, n consecutive "!" values are determined and the escalator 501 selects the next escalation stage ES3. After a few "1" values, a single "0" value occurs and the escalator 501 clears the escalation to escalation stage ES0.

Now, in this example, two "0" values follow interrupted by a couple of "1" values (wherein each interruption comprises less than n "1" values) before a consecutive number of 5 times n "1" values appear at the output of the comparator 209 and result in an escalation from the escalation stage ES0 to the escalation stage ES5. The next 2 times n "1" values do not result in a further escalation, because in this example the escalation stage ES5 is the highest escalation stage possible. Hence, the remaining n "1" values result in maintaining this maximum escalation stage ES5. After a few additional "1" values, a single "0" value occurs and the escalator 501 clears the escalation to escalation stage ES0. This example concludes with four "0" values interrupted by a couple of (but less than n) "1" values.

It is noted that the number of consecutive "1" values determining the observation period per escalation stage may at least partially differ between escalation stages. According to the example shown in FIG. 6, different numbers $n_{ES0}, \ldots, n_{ES5}$ may be used for the different escalation stages ES0 to ES5.

The escalation scheme reduces the power consumption of the AC detection, because the sampling period may be self-adjusting to a value needed to determine the (at least one) "0" value. Most of the time, the sampling period may be longer, leading to a reduced average power consumed. Detecting said the "0" value may correspond to having discharged the capacitance to at least a voltage level considered safe.

The examples suggested herein may in particular be based on at least one of the following solutions. In particular combinations of the following features could be utilized in order to reach a desired result. The features of the method could be combined with any feature(s) of the device, apparatus or system or vice versa.

A method is provided, said method comprising the steps:
sampling an input signal at a sampling rate, wherein the input signal is based on an AC signal;
comparing the input signal with a threshold signal,
determining a first value in case the input signal is larger than the threshold signal;

determining at least one second value in case the input signal is smaller than the threshold signal;
increasing the sampling rate in case a predefined number of consecutive first values is determined;
decreasing the sampling rate in case at least one second value is determined.

The input signal is based on the AC signal, i.e. any kind of alternating voltage and/or current signal, in case the AC signal is temporarily or permanently connected. The input signal may also be based on the AC signal after the AC signal has been disconnected. This may apply for a plug connected to an AC power network. The plug may be disconnected from its socket. In any case (connected or disconnected after it was connected) the input signal is based on the AC signal.

The first value may be a "1" value or a "0" value supplied by an output of a comparator. The second value may then be the respective opposite "0" or "1" value. According to one or more examples described herein, the first value may be the "1" value and the second value may be the "0" value.

The sampling rate may in particular be decreased in case one or more second valued are determined, wherein said at least two second valued do not have to occur consecutively. In fact, the several second values may be interrupted by first values. This is beneficial in case of noise at the comparator.

It is noted that the first value can be determined in case the input signal equals the threshold signal. As an alternative, the second value can be determined in case the input signal equals the threshold signal.

The example presented allows detecting an AC signal that is present (or not) at input terminals of a power supply. If the AC signal is no longer detected, the incremental increase of the sampling rate results in a higher load at the input terminals and discharges the capacitors that may otherwise supply a high voltage at the input pins of the power supply, which are easily accessible after a power plug is disconnected from its socket. Hence, the example efficiently reduces the risk for a person being exposed to a high voltage by touching the pins of the disconnected power plug. Discharging the capacitors can be achieved within a predefined time limit by applying the escalation scheme suggested herein.

In an example, the threshold signal is set such that the AC signal is considered safe when the at least one second value is determined.

The AC signal may be deemed "safe" in case a pin to which it may be applied can be touched, e.g., by a finger, without any harmful impact to the touching object.

In an example, the AC signal is provided by tapping an AC line.

The AC signal may be supplied directly or indirectly via the AC (supply) line, which may be tapped on a primary or secondary side of an EMI filter of a power supply. Both terminals of the AC line may be tapped via a diode in order to rectify the alternating signal. As an alternative, only one terminal of the AC line may be tapped. As a further alternative, one or both terminals of the AC line may be tapped via a resistor and a capacitor.

As a result, such tapping allows the input signal to correspond to the alternating signal that may be conveyed via a power supply system.

In an example, the method further comprises the step:
sampling the input signal at the increased sampling rate or at the decreased sampling rate.

Hence, the input signal can be sampled by utilizing the adjusted sampling rate, i.e. the increased sampling rate or the decreased sampling rate.

In an example, the method further comprises the step:
decreasing the sampling rate to an initial value in case the at least one second value is determined.

The initial sampling rate may be a sampling rate used during a power-save mode. The initial sampling rate may be the lowest sampling that can be selected. The initial sampling rate may be substantially in the order of the frequency of the AC signal.

In an example, the sampling rate is decreased in case the second value is determined for a single time.

Hence, detecting (determining) the second value for a single time may be used as a criterion to clear the escalation to its initial sampling rate.

In an example, the method comprises the steps:
increasing an escalation stage by increasing the sampling rate each time a predefined number of consecutive first values is determined;
decreasing the escalation stage by decreasing the sampling rate in case the at least one second value is determined.

Hence, the escalation scheme may utilize several stages, wherein with each stage the sampling rate is increased.

The number of consecutive first values of an actual escalation stage may determine an observation time. When the observation time is over, the next escalation stage (if still available) is invoked or the at least one second value is detected. Due to the at least one second value, the sampling rate may be decreased, in particular the escalation stages may be cleared and the initial sampling rate may be applied.

In an example, the predefined number of consecutive first values is different for at least two escalation stages.

In an example, the predefined number of consecutive first values is identical for each of the escalation stages.

In an example, the escalation stage is increased until a maximum escalation stage is reached.

In case the maximum escalation stage is reached, the sampling rate of the maximum escalation stage may be maintained until at least one second value is determined.

In an example, the threshold signal is based on a digital signal that is converted by a digital-to-analog converter.

In an example, the method further comprises the step:
counting the consecutive first values by a counter determining at least two consecutive first values.

In an example, the method further comprises the step:
providing the input signal via a voltage divider that is connected to the AC signal.

In an example, the method further comprises the step:
controlling the sampling rate via an electronic switch that is connected in a current path together with the voltage divider.

The electronic switch may be a high voltage transistor that is connected in series with the voltage divider or between resistors of the voltage divider. The current path may be connected, e.g., via at least one diode, to at least one pole of the AC signal.

In an example, the method is run in a loop returning to an initial sampling rate each time the at least one second value is determined.

A device is provided, said device comprising a processing unit that is arranged for
sampling an input signal at a sampling rate, wherein the input signal is based on an AC signal;
comparing the input signal with a threshold signal,
determining a first value in case the input signal is larger than the threshold signal;
determining at least one second value in case the input signal is smaller than the threshold signal;

increasing the sampling rate in case a predefined number of consecutive first values is determined;

decreasing the sampling rate in case the at least one second value is determined.

It is noted that the steps of the method stated herein may be executable on this processing unit as well.

It is further noted that said processing unit can comprise at least one, in particular several means that are arranged to execute the steps of the method described herein. The means may be logically or physically separated; in particular several logically separate means could be combined in at least one physical unit.

Said processing unit may comprise at least one of the following: a processor, a microcontroller, a hard-wired circuit, an ASIC, an FPGA, a logic device.

The device may be realized as an integrated circuit.

In an example, the device comprises a digital-to-analog converter for supplying the threshold signal based on a digital signal.

In an example, the device comprises a voltage divider that is directly or indirectly connectable to the AC signal, wherein the input signal is provided by the voltage divider.

In an example, the device comprises an electronic switch that is connected in a current path together with the voltage divider.

In an example, the device is implemented on a single chip or die.

The device may be realized as an integrated circuit, wherein the electronic switch may be integral part of the integrated circuit or it may be arranged separate to the integrated circuit.

Further, a device is suggested, said device comprising:
means for sampling an input signal at a sampling rate, wherein the input signal is based on an AC signal;
means for comparing the input signal with a threshold signal,
means for determining a first value in case the input signal is larger than the threshold signal;
means for determining at least one second value in case the input signal is smaller than the threshold signal;
means for increasing the sampling rate in case a predefined number of consecutive first values is determined;
means for decreasing the sampling rate in case the at least one second value is determined.

A computer program product is suggested, directly loadable into a memory of a digital processing device, comprising software code portions for performing the steps of the method as described herein.

Although various examples have been disclosed, it will be apparent to those skilled in the art that various changes and modifications can be made which will achieve some of the advantages without departing from the spirit and scope of this disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods consistent with this disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g. according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

The invention claimed is:

1. A method comprising:
by a device that is configured to prevent a power converter from inflicting harm due to unintended discharge of a capacitance of the power converter,
sampling an input signal at a sampling rate, wherein the input signal is based on an AC signal at an input of the power converter;
comparing a sample value of the input signal obtained at the sampling rate with a threshold value;
incrementing, based on the comparing, a count value when at least the sample value is greater than the threshold value; and
increasing the sampling rate of the input signal responsive to the count value reaching a predefined integer value, wherein for sampling the input signal the device is configured to draw power from the capacitance of the power converter at a rate that is proportional to the sampling rate so that an increase in sampling rate results in an increase in rate of discharge of the capacitance to prevent the power converter from inflicting harm due to unintended discharge of the capacitance of the power converter.

2. The method according to claim 1, wherein the threshold signal is set such that the AC signal is considered safe when the a particular value for the sample value is determined.

3. The method according to claim 1, wherein the AC signal is provided by tapping an AC line.

4. The method according to claim 1, further comprising:
decreasing the sampling rate when the sample value is determined as at least one second value.

5. The method according to claim 4, further comprising:
decreasing the sampling rate to an initial value when the at least one second value is determined.

6. The method according to claim 4, wherein the sampling rate is decreased when the second value is determined for a single time.

7. The method according to claim 1, further comprising:
increasing the sampling rate when a predefined number of consecutive sample values are greater than the threshold value, and wherein a value for the predefined number of consecutive sample values is different for at least two escalation stages.

8. The method according to claim 1, further comprising:
increasing the sampling rate when a predefined number of consecutive sample values are greater than the threshold value, and wherein a value for the predefined number of consecutive sample values is identical for each one of a number of escalation stages.

9. The method according to claim 1, further comprising:
increasing the sampling rate until a maximum escalation stage is reached.

10. The method according to claim 1, wherein the threshold value is based on a digital signal that is converted by a digital-to-analog converter.

11. The method according to claim 1, further comprising:
incrementing the count value by a counter determining at least two consecutive first values.

12. The method according to claim 1, further comprising:
providing the input signal via a voltage divider that is connected to the AC signal.

13. The method according to claim 12, further comprising:
controlling the sampling rate via an electronic switch that is connected in a current path together with the voltage divider.

14. The method according to claim 1, wherein the method is run in a loop returning to an initial sampling rate each time a particular sample value for the input signal is determined.

15. A device comprising a processing unit that is arranged for:
sampling an input signal at a sampling rate, wherein the input signal is based on an AC signal at an input of a power converter;
comparing a sample value of the input signal obtained at the sampling rate with a threshold value;
incrementing, based on the comparing, a count value when at least the sample value is greater than the threshold value; and
increasing the sampling rate of the input signal responsive to the count value reaching a predefined integer value, wherein for sampling the input signal the processing unit is arranged for the device to draw power from a capacitance of the power converter at a rate that is proportional to the sampling rate so that an increase in sampling rate results in an increase in rate of discharge of the capacitance to prevent the power converter from inflicting harm due to unintended discharge of the capacitance of the power converter.

16. The device according to claim 15, the device comprising a digital to analog converter for supplying the threshold value based on a digital signal.

17. The device according to claim 15, the device comprising a voltage divider that is directly or indirectly connectable to the AC signal, wherein the input signal is provided by the voltage divider.

18. The device according to claim 17, the device comprising an electronic switch that is connected in a current path together with the voltage divider.

19. The device according to claim 15, wherein the device is implemented on a single chip or die.

20. A device comprising:
means for sampling an input signal at a sampling rate, wherein the input signal is based on an AC signal at an input of a power converter;
means for comparing a sample value of the input signal obtained at the sampling rate with a threshold value;
means for incrementing, based on the comparing, a count value when at least the sample value is greater than the threshold value; and
means for increasing the sampling rate of the input signal responsive to the count value reaching a predefined integer value, wherein for sampling the input signal the device is configured to draw power from the capacitance of the power converter at a rate that is proportional to the sampling rate so that an increase in sampling rate results in an increase in rate of discharge of the capacitance to prevent the power converter from inflicting harm due to unintended discharge of the capacitance of the power converter.

21. A non-transitory computer readable storage medium storing instructions that when executed cause one or more processors of a device to:
cause the device to sample an input signal at a sampling rate, wherein the input signal is based on an AC signa at an input of a power converter;

cause the device to compare a sample value of the input signal obtained at the sampling rate with a threshold value;
cause the device to increment, based on the compare, a count value when at least the sample value is greater than the threshold value; and
cause the device to increase the sampling rate of the input signal responsive to the count value reaching a predefined integer value, wherein to sample the input signal the device is configured to draw power from a capacitance of the power converter at a rate that is proportional to the sampling rate so that an increase in sampling rate results in an increase in rate of discharge of the capacitance to prevent the power converter from inflicting harm due to unintended discharge of the capacitance of the power converter.

\* \* \* \* \*